United States Patent [19]
Joshi et al.

[11] Patent Number: 5,221,853
[45] Date of Patent: Jun. 22, 1993

[54] MOSFET WITH A REFRACTORY METAL FILM, A SILICIDE FILM AND A NITRIDE FILM FORMED ON AND IN CONTACT WITH A SOURCE, DRAIN AND GATE REGION

[75] Inventors: Rajiv V. Joshi, Yorktown Heights, N.Y.; Choon-Sik Oh, Seoul, Rep. of Korea; Dan Moy, Bethel, Conn.

[73] Assignee: International Business Machines Corporation, Armonk, N.Y.

[21] Appl. No.: 763,194

[22] Filed: Sep. 20, 1991

Related U.S. Application Data

[60] Division of Ser. No. 322,486, Mar. 13, 1989, Pat. No. 5,084,417, which is a continuation-in-part of Ser. No. 294,014, Jan. 6, 1989, abandoned.

[51] Int. Cl.$^5$ .................. H01L 29/76; H01L 23/48
[52] U.S. Cl. .................. 257/384; 257/383; 257/413; 257/755; 257/764
[58] Field of Search .................. 357/23.1, 65, 67, 71, 357/71 S; 437/192, 200; 257/382, 383, 384, 412, 754, 757, 764, 767, 768, 770, 413

[56] References Cited

U.S. PATENT DOCUMENTS

| | | | |
|---|---|---|---|
| 3,881,242 | 5/1975 | Nuttall et al. | 357/59 |
| 4,565,157 | 1/1986 | Brors et al. | 118/719 |
| 4,617,087 | 10/1986 | Iyer et al. | 156/643 |
| 4,640,004 | 2/1987 | Thomas et al. | 357/71 |
| 4,701,349 | 10/1987 | Koyanagi et al. | 427/228 |
| 4,746,219 | 5/1988 | Holloway et al. | 357/71 S |
| 4,769,686 | 9/1988 | Horiuchi et al. | 357/71 S |
| 4,822,753 | 4/1989 | Pintchovski et al. | 437/200 |
| 4,847,111 | 7/1989 | Chow et al. | 437/200 |
| 4,851,295 | 7/1989 | Brors | 437/200 |
| 4,855,798 | 8/1989 | Imamura et al. | 357/71 |
| 4,924,281 | 5/1990 | Endo et al. | 357/71 |
| 4,926,237 | 5/1990 | Sun et al. | 357/71 |
| 5,027,185 | 6/1991 | Liauh | 357/71 |
| 5,045,916 | 9/1991 | Vor et al. | 357/71 |
| 5,084,417 | 1/1992 | Joshi et al. | 437/40 |
| 5,138,432 | 8/1992 | Stanasolovich et al. | 357/71 |

FOREIGN PATENT DOCUMENTS

| | | | |
|---|---|---|---|
| 0077535 | 4/1983 | European Pat. Off. | 357/71 |
| 0254651 | 1/1988 | European Pat. Off. | 357/71 |
| 0305143 | 3/1989 | European Pat. Off. | 357/71 |
| 59-72132 | 4/1984 | Japan | 357/71 |
| 60-225475 | 11/1985 | Japan | 357/71 S |
| 61-97825 | 5/1986 | Japan | 437/200 |
| 61-221376 | 10/1986 | Japan | 357/71 |
| 62-33470 | 2/1987 | Japan | 357/41 |
| 63-9925 | 1/1988 | Japan | 437/200 |
| 63-181422 | 7/1988 | Japan | 437/200 |
| 63-308315 | 12/1988 | Japan | 437/200 |

OTHER PUBLICATIONS

IEEE Electron Device Letters, vol. 9, No. 2, Feb., 1988, "Al/W/TiN$_x$/TiSi$_y$/Si Barrier Technology for 1.0-$\mu$m Contacts" by Sun et al, pp. 71–73.

Kotani, H., et al., "A Highly Reliable Selective CVD-W Utilizing SiH$_4$ for VLSI Contacts", *IEDM*, 87-217 (1987).

Ting, C. Y., et al., "The Use of TiSi$_2$ is a Self-Aligned Silicide Technology".

Ahn, K. Y., et al., "Tungsten-on-Conducting Nitride
(List continued on next page.)

*Primary Examiner*—Rolf Hille
*Assistant Examiner*—Steven Loke
*Attorney, Agent, or Firm*—Scully, Scott, Murphy & Presser

[57] ABSTRACT

Selective deposition of a refractory metal on a silicon substrate utilizing high temperatures and a silane reduction process in which the flow rate ratio of silane to refractory metal halide gas is less than one. In a second embodiment, an additional layer of the refractory metal is deposited utilizing a hydrogen reduction of the metal halide gas at very high temperatures. In both embodiments, a refractory metal barrier layer may be provided by forming a self-aligned refractory metal silicide layer. Alternatively, a two layer self-aligned barrier is formed of a refractory metal silicide lower layer and a refractory metal nitride upper layer and the refractory metal is selectively deposited on the metal nitride.

4 Claims, 5 Drawing Sheets

OTHER PUBLICATIONS

Composite Films", *IBM Tech. Disclosure Bulletin*, 31(3):477 (1988).

Moriya, T., et al., "A Planar Metallization Process—Its Application To Tri-Level Aluminum Interconnection", *IEDM*, 550 (1983).

Gargini, P. A., et al., "WOS:Low Resistance Self-Aligned Source, Drain and Gate Transistors", *IEDM*, 54 (1981).

Rana, V. V. S., et al., "Thin Layers of TiN and Al As Glue Layers for Blanket Tungsten Deposition," *Materials Research Society*, 187 (1987).

Ohba, T., et al., "Selective CVD Tungsten Silicide for VLSI Applications", *IEDM* 213 (1987).

Ahn, K. Y., et al., "Underlayer for Polycide Process", *IBM Tech. Disclosure Bulletin*, 28(9):3986 (1986).

Emma, S. A., et al., "Selective Tungsten Silicide Deposition", *IBM Tech. Disclosure Bulletin*, 29(5):2195 (1986).

Iyer, S. S., et al., "Cobalt Metallurgy for VLSI", *IBM Tech. Disclosure Bulletin*, 29(5):2197 (1986).

Carlsson, J., et al., "Thermodynamic Investigation of Selective Tungsten Chemical Vapor Deposition: Influence of Growth Conditions and Gas Additives on the Selectivity in the Fluoride Process", *Thin Solid Films*, 158:107 (1988).

Chen, J. Y., et al., "Refractory Metals and Metal Silicides for VLSI Devices", *Solid State Technology*, 145 (1984).

Kusumoto, Y., et al., "A New Approach to the Suppression of Tunneling", *Materials Research Society*, 103 (Apr. 1, 1988).

Rosler, R. S., et al., "Tungsten Chemical Vapor Deposition Characteristics Using $SiH_4$ in a Single Wafer System", *J. Vac. Sci. Technol.*, (B6(6):1721 (Nov./Dec. 1988).

Schmitz, J. et al., "Comparison of Step Coverage and Other Aspects of the $H2/WF6$ and $SiH_4/WF6$ Reduction Schemes Used in Blanket LPCVD of Tungsten", *Proc. Electrochem. Soc.*, 87-8, 625 (1987).

Schutz, R. J., "TiN as a Diffusion Barrier Between $CoSi_2$ or PtSi and Aluminum", *MRS Proceedings*, 18, 89 (1982).

Suguro, K., et al., "High Aspect Ratio Hole Filling by Tungsten Chemical Vapor Deposition Combined with a Silicon Sidewall and Barrier Metal for Multilevel Interconnection", *J. Appl. Phys.*, 62(4):1265 (1987).

Wolf, S., et al., "Silicon Processing for the VLSI Era vol. 1: Process Technology", pp. 384–406 (1986).

MOSFET WITH A REFRACTORY METAL FILM, A SILICIDE FILM AND A NITRIDE FILM FORMED ON AND IN CONTACT WITH A SOURCE, DRAIN AND GATE REGION

This application is a divisional of copending application Ser. No. 322,486, filed on Mar. 13, 1989, now U.S. Pat. No. 5,084,417, which is a continuation-in-part of U.S. Ser. No. 294,014 filed Jan. 6, 1989, now abandoned.

BACKGROUND OF THE INVENTION

1. Field of the Invention

The present invention relates to deposition techniques for forming metal regions on semiconductor substrates, and more particularly, to the selective deposition of refractory metals on a refractory metal nitride and/or silicide barrier layer and the semiconductor devices formed thereby.

2. Description of the Prior Art

The continued miniaturization of integrated circuits has brought about an increasing need to reduce the resistance in the source-drain-gate and contact metallurgy. In recent years, much effort has been focused on the use of metal silicides to fulfill this need. However, as device dimensions become even smaller, both vertically and horizontally, silicides lose their attractiveness. The intrinsic resistivity of the silicides is high compared to metals, while the formation of self-aligned silicides consumes silicon in proportion to the thickness of the silicide that is formed. This consumption usually leads to junction leakage which is intolerable. U.S. Pat. No. 4,701,349 is directed to a method for depositing a self-aligned interconnect comprised of a layer of titanium nitride and a layer of titanium silicide. The sheet resistance of the titanium nitride layer is on the order of 15 ohm/sq.

Refractory metals have been investigated as possible alternatives to silicides. The low resistances and relatively high temperature stability makes the refractory metals attractive. In addition, the recent development of selective chemical vapor deposition (CVD) processes, have made tungsten and molybdenum prime candidates to replace silicides. In accordance with the CVD technique, tungsten (W) is deposited on the surface areas by placing the substrate in a CVD reactor and heating the substrate. Tungsten hexafluoride ($WF_6$) and an inert carrier gas such as argon (Ar) or nitrogen ($N_2$) are then fed into the reactor and the tungsten hexafluoride will react with the silicon in accordance with the following:

The deposition of tungsten will stop and in order to deposit additional material, hydrogen ($H_2$) is added to the tungsten hexafluoride and carrier gas. The tungsten hexafluoride will react with the hydrogen to deposit the desired additional tungsten in accordance with the following:

The use of the above hydrogen reduction process to selectively deposit tungsten for VLSI applications has been limited by problems inherent in the deposition process. The problems include unpredictable, deep tungsten penetration into silicon regions (worm holes) due to attack of HF liberated in the reaction. In addition, encoachment problems occur due to the tungsten penetrating along nearby silicon dioxide/silicon interfaces. Furthermore, problems result from the poor adhesion of the tungsten to silicon.

Kotani, et al., IEDM (1987 IEEE) disclose a CVD process for the selective deposition of tungsten utilizing silane ($SiH_4$) reduction. Kotani, et al. use a low temperature and pressure CVD process that results in the formation of undesirable silicide peaks which increase the resistivity of the tungsten layer to about 20 $\mu$ohm-cm.

The use of barrier layers to enhance adhesion and lower contact resistance for tungsten films has been recently demonstrated by Brodsky, et al., IBM Tech. Bull., Feb. 1986. A titanium nitride layer was deposited by sputtering prior to the tungsten deposition by sputtering, electron beam evaporation or low pressure CVD. However, adhesion and resistance difficulties have been encountered in the deposition of selective tungsten on these barriers.

SUMMARY OF THE INVENTION

The present invention is directed to a method for selectively depositing a refractory metal layer on exposed silicon surfaces of a silicon substrate utilizing the silane reduction of a refractory metal halide. The deposition is performed in a high temperature CVD system in which the silane/refractory metal hexafluoride gas flow rate ratio is less than one. The high temperatures and the low flow rate ratio result in the formation of a refractory metal layer having a resistivity of less than 17 $\mu$ohm-cm. The process is performed in a CVD deposition apparatus at temperatures in the range of 370° to 550° C. In an alternative embodiment, after an initial layer of refractory metal is deposited utilizing the silane reduction of the refractory metal halide process, hydrogen is introduced into the deposition apparatus in place of silane and the hydrogen reacts with the refractory metal halide to further selectively deposit refractory metal on the substrate. The additional hydrogen reduction step is also performed at high temperatures, which are typically above 500° C.

In the use of the process of the present invention for field effect transistor (FET) metallization, it is preferred that a barrier layer be introduced between the silicon and the refractory metal layer to prevent encroachment. In this embodiment, a refractory metal barrier layer is deposited prior to the deposition of the refractory metal layer. The barrier layer may be formed of a single layer of a refractory metal silicide or it may be a two layer structure having a refractory metal silicide as a lower layer and a refractory metal nitride as an upper layer. The barrier layer or layers are deposited using a self-aligned deposition process eliminating the need for photolithographic masks. Initially, the blanket layer of refractory metal is deposited on the substrate and the substrate is annealed to convert the metal to a metal silicide where the metal is in contact with silicon. The unreacted metal is then removed using a selective chemical etchant. Thereafter, the upper surface of the metal silicide layer is converted to a metal nitride layer by annealing in an ammonia atmosphere with or without plasma. After formation of the barrier layer, the refractory metal layer is deposited as indicated above.

DETAILED DESCRIPTION OF THE INVENTION

In accordance with the present invention, a refractory metal is selectively deposited on a silicon substrate utilizing a high temperature CVD process of silane reduction of the refractory metal halide. In accordance with the inventive method, the ratio of the silane/refractory metal halide flow rates is less than one. The method of the invention may be utilized to deposit a refractory metal as a contact for a semiconductor device and as an interlevel via interconnect.

Figure 1:
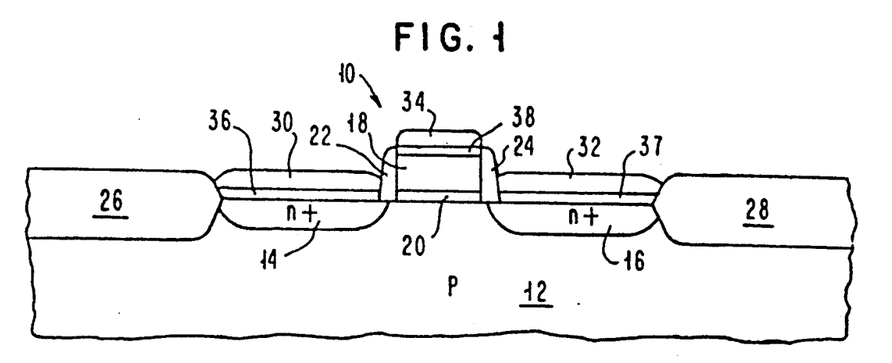
FIG. 1 is a schematic drawing showing the cross-section of an integrated circuit chip including the deposition of the refractory metal using the method of the present invention.

FIG. 1 shows a device structure having the refractory metal contacts formed thereon. The device 10 is a MOS field effect transistor having a silicon substrate 12 and source and drain diffusion regions 14 and 16. A silicon gate electrode 18 is formed by typical photolithographic techniques with a gate oxide layer 20 and sidewall silicon dioxide spacers 22 and 24. Recessed oxide isolation regions 26 and 28 separate the structure 10 from other devices on the chip. The refractory metal contact layer is selectively deposited on the source, drain and gate regions to form contacts 30, 32 and 34, respectively. The illustrative embodiment shown in FIG. 1 includes barrier layers 36, 37 and 38 disposed between the refractory metal layers and the underlying silicon. The barrier layers are formed by a self-aligned process to be described in detail below.

Figure 2:
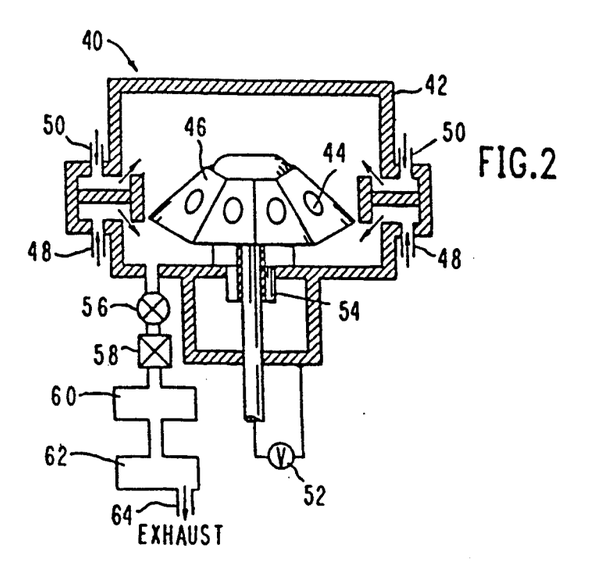
FIG. 2 is a schematic drawing which illustrates a typical apparatus used in the method of the present invention.

The method of the present invention may be carried out in a typical CVD apparatus as shown in FIG. 2. The apparatus 40 includes a deposition chamber 42 having the substrate specimens 44 disposed on a turret 46. In accordance with the process for the silane reduction of the refractory metal halide, the silane gas, $SiH_4$, is introduced into the chamber 42 through ports 48 and the refractory metal halide gas, such as $WF_6$, is introduced into the chamber 30 through ports 50. $SiH_4$ can be introduced in the chamber before or after the introduction of $WF_6$ and in either case the ratio of less than one can be maintained. Excitation is provided by the rf generator 52 and an infrared sensor lamp assembly 54 is also provided A high vacuum valve 56, a throttle 58, a blower 60 and a pump 62 are provided to exhaust chamber 42 through port 64.

Refractory metals suitable for the formation of contacts and interlayer interconnects include tungsten, molybdenum and tantalum. Suitable refractory metal halides for the present method include pentachlorides, hexachlorides, pentafluorides and hexafluorides. In an illustrative embodiment of the invention, tungsten is deposited by introducing silane gas and tungsten hexafluoride gas into the chamber 42 wherein the gases will react to deposit tungsten selectively on the exposed silicon surfaces in accordance with the following:

$$2WF_6 + 3SiH_4 \rightarrow 2W + 3SiF_4 + 6H_2$$

The silane reduction of tungsten hexafluoride provides a very high deposition rate with excellent electrical characteristics. In accordance with the method of the invention, the ratio of the flow rates of silane to the $WF_6$ is less than one and preferably is approximately 0.2 to 0.6. In addition, the CVD deposition takes place at relatively high turret temperatures in the range of 370° to 550° C. Preferably, the temperature range is between 430° to 480° C.

In the above embodiment, the entire thickness of the tungsten deposited on the silicon substrate is by the silane reduction process. In a second embodiment, after depositing a layer of tungsten by the silane reduction process, $H_2$ is introduced into the deposition chamber 42 in place of the silane through port 48. The hydrogen will react with the $WF_6$ to further selectively deposit tungsten in accordance with the following:

$$WF_6 + 3H_2 \rightarrow W + 6HF$$

The hydrogen reduction process is carried out at high turret temperatures, typically above 500° C. and preferably at 550° C. The formation of HF is not damaging to underlying layers because of the protection provided by the initial layer of tungsten deposited by the silane reduction process.

When the refractory metal halide is a pentahalide such as tantalum pentachloride the tantalum is selectively deposited on the exposed silicon surfaces in accordance with the following:

$$4TaCl_5 + 5SiH_4 \rightarrow 4Ta + 5SiCl_4 + 10H_2$$

Upon introduction of hydrogen after depositing a layer of tantalum, the hydrogen will react with the $TaCl_5$ in accordance with the following:

$$2TaCl_5 + 5H_2 \rightarrow 2Ta + 10HCl$$

In another embodiment of the invention, a self-aligned barrier layer is sandwiched between the tungsten and the silicon. The barrier layer may take the form of a refractory metal silicide alone, or in combination with a refractory metal nitride. In addition certain noble metal silicides may also be used to form the barrier layer.

Figures 3A, 3B:
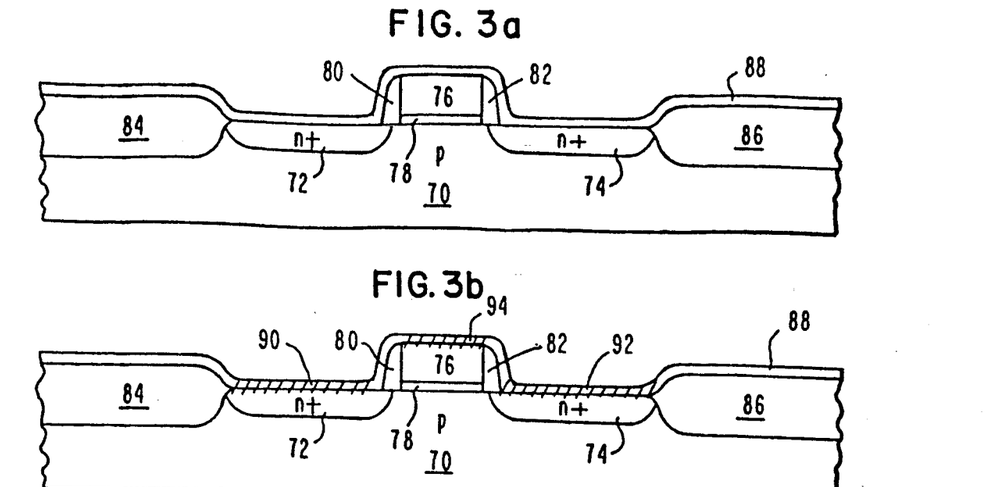
FIGS. 3a-3e are sectional views, each showing the production steps accordance with the method of the present invention for forming the barrier layer and the refractory metal layer.

FIGS. 3a-3e show the production steps for the formation of the barrier layer and subsequent tungsten deposition As shown in FIG. 3a, a substrate structure ready for formation of metal contacts includes a substrate 70 having source and drain diffusion regions 72 and 74 and a gate region 76 of polysilicon. The structure further includes gate oxide region 78 and gate sidewall spacer silicon dioxide regions 80 and 82. Recessed oxide isolation regions 84 and 86 are also provided. In the first step of the process of forming a barrier layer, a thin blanket layer 88 of pure refractory metal is deposited on the oxide and silicon windows.

Typical refractory metals that can be utilized to form the barrier layer are titanium (Ti), niobium, zirconium, chromium, hafnium. The typical noble metals are cobalt and platinum. The preferred choice for forming a refractory metal silicide is titanium. $TiSi_2$ has the lowest resistivity among the refractory metal silicides. In addition, due to its oxygen gettering capability, Ti is a good oxide reducing agent. Ti can dissolve silicon native oxide and can consistently form $TiSi_2$ upon annealing without much difficulty. It has been shown that subsequent contact integrity can be preserved if a barrier layer such as $TiSi_2$ is placed between the tungsten and the silicon to stop silicon diffusion into the contact.

In addition, a composite silicide layer may be formed by combining two refractory metals. For example, one of the above mentioned refractory metals may be combined with any other refractory metal, such as tungsten, to form a composite silicide, $Ti$-$W$-$Si_2$. Any other combination of refractory metals may be used to form the silicide barrier layer.

For many applications, a layer of $TiSi_2$ may be a sufficient barrier to allow the subsequent selective deposition of tungsten to occur without the encroachment and penetration problems described above. However, for titanium silicide, it has been found that an additional barrier layer of titanium nitride be disposed between the titanium silicide layer and the tungsten to provide further protection and to reduce the contact resistivity of the W/TiN/$TiSi_2$ structure.

The blanket layer of titanium is deposited by conventional techniques, such as, by chemical vapor deposition, to a thickness of anywhere from 50 to 500 angstroms. However, it is preferred that a layer be as thin as possible and on the order of 50 to 200 angstroms.

Next, as shown in FIG. 3b, the substrate is annealed at approximately 670° C. for 30 minutes in a nitrogen atmosphere causing the underlying silicon in regions 72, 74 and 76 to react with the titanium in layer 88 to form $TiSi_2$ in regions 90, 92 and 94 with $TiN_xO_y$ on the surface. The titanium layer 88 on the silicon dioxide regions 80, 82, 84 and 86 does not form silicide, but forms $TiN_xO_y$ which can be selectively removed. The values x and y can take on any value between 0 and 1.

Figure 3C:
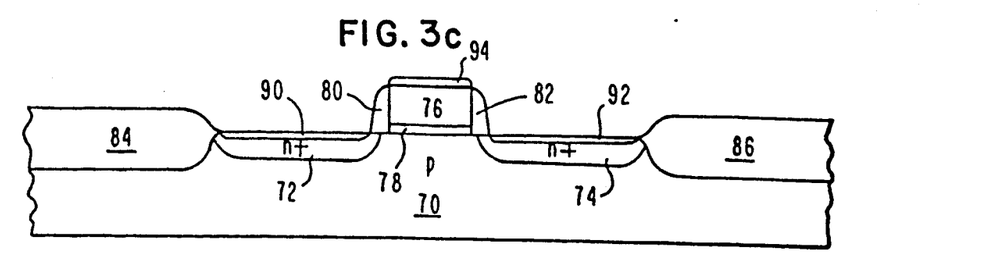

Next, as shown in FIG. 3c, the unnecessary titanium layer 88 on the recessed oxide regions 84 and 86 and on the sidewall spacers 80 and 82 is removed selectively by etching. An etching solution of a hydrogen peroxide and sulphuric acid type can be used as the etching solution for this purpose. This type of etching solution does not act upon the titanium silicide layers 90, 92 and 94. Annealing at a temperature above 700° may result in the formation of TiSiO on the oxide regions which must be removed by using an aqueous solution of hydroflouric acid. However, if the initial anneal is performed at 700° C. or less, the silicide formation over the oxide is minimal and can be etched off with the hydrogen peroxide and sulphuric acid solution.

Figure 3D:
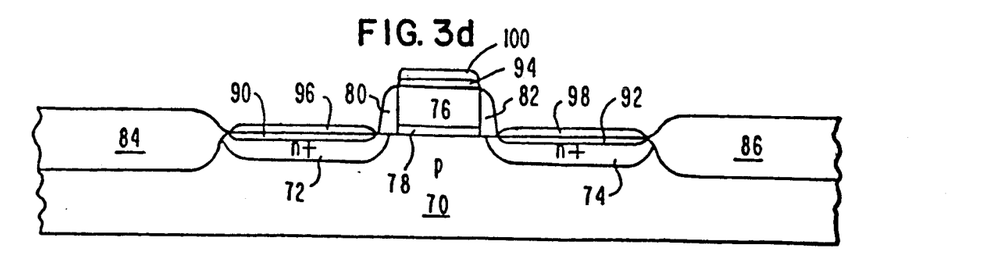
Figure 3E:
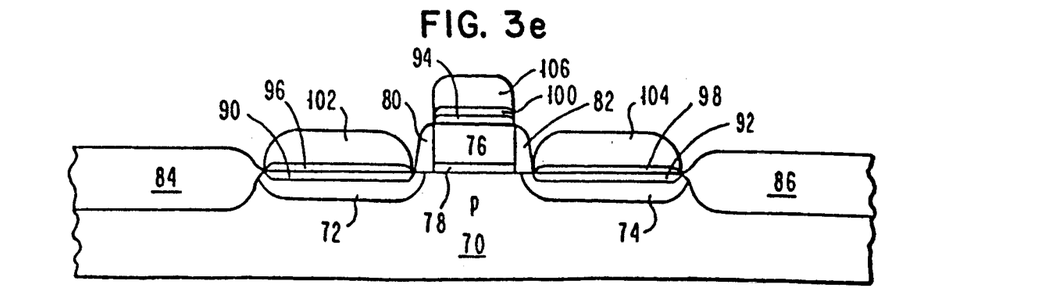

Thereafter, as shown in FIG. 3d, annealing is performed at approximately 800° C. or above for 30 minutes in a nitrogen atmosphere which both converts the titanium silicide to $TiSi_2$ and converts the surface of the titanium silicide layer to titanium nitride. To increase the thickness of TiN, $TiSi_2$ is annealed in $NH_3$ which is very reactive compared to $N_2$. Also $TiSi_2$ formed at 675° C., for 30 minutes in $N_2$ can be directly subjected to an $NH_3$ anneal at 675° C., for 30 minutes. Thus, the same temperature at which the first anneal is done can be used for the $NH_3$ anneal. Thus, the resulting barrier layers comprise lower layers 90, 92 and 94 of $TiSi_2$ and upper layers 96, 98 and 100 of TiN. As a result of the high temperature annealing, the resistivity of the titanium silicide layer is substantially reduced to a very low value. The sheet resistance of the film is approximately 6–10 ohm/sq. Although the titanium nitride layer has a sheet resistance greater than the titanium silicide layer, the relative sheet resistance of the entire barrier layer is significantly reduced. Thus, the two layer barrier layer is formed in a self-aligned manner without the need for photolithographic masks. As shown in FIG. 3e, the selective deposition of the refractory metal such as tungsten is carried out in accordance with the method described above in the present invention to form source, drain and gate contacts 102, 104 and 106.

In the silane reduction step of the invention for selectively depositing tungsten, the $WF_6$ and the $SiH_4$ flow rates are in the range between 20–300 SSCM, with the criteria that the ratio of $SiH_4/WF_6$ be less than one and preferably approximately 0.4 to 0.6. The temperature as mentioned above is in the range 370° to 550° C. and the pressure is in the range from 100 to 500 mT. For the hydrogen reduction step, the $H_2$ flow rate is between 3,000 to 4,000 SSCM and the $WF_6$ flow rate is between 200 to 300 SSCM. The pressure is between 100 to 2,000 mT and the temperature is approximately 550° C. In one specific example of the silane reduction step, $WF_6$ was first introduced at a flow rate of 200 SSCM and $SiH_4$ was subsequently introduced at a flow rate of 90 SSCM resulting in a $SiH_4/WF_6$ ratio of 0.45. The temperature was 480° C. and the pressure was 200 mT. Approximately, 300 nanometers of tungsten was uniformly deposited selectively on a TiN/$TiSi_2$ barrier with a growth rate of approximately 60 nm/min. The sheet resistance was approximately 0.3 ohm/sq and the resistivity was approximately 9 $\mu$ohm-cm.

In a second example, after the deposition of 100 nm of tungsten in accordance with the first example, the flow of $SiH_4$ was stopped and $H_2$ was introduced at a flow rate of 4,000 SSCM. The temperature was then increased up to 550° C. and the pressure was 400 mT. The deposition process took place in approximately 30 minutes and resulted in a total amount of approximately 1200 nm of tungsten uniformly deposited on the TiN with a growth rate of around 40 nm/min. The sheet resistance was about 0.065 to 0.08 ohm/sq. resistivity was approximately 8–9 $\mu$ohm-cm.

Figure 4:
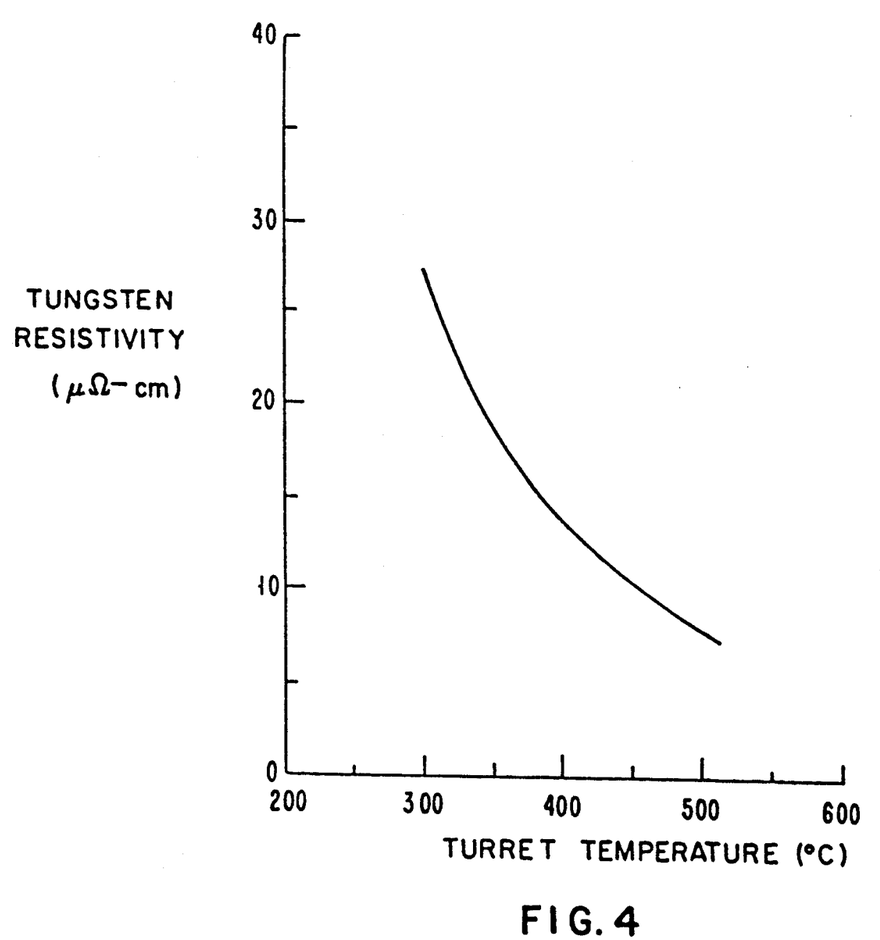
FIG. 4 is a plot of resistivity versus turret temperature of a refractory metal film formed in accordance with the method of the present invention.
Figure 5:
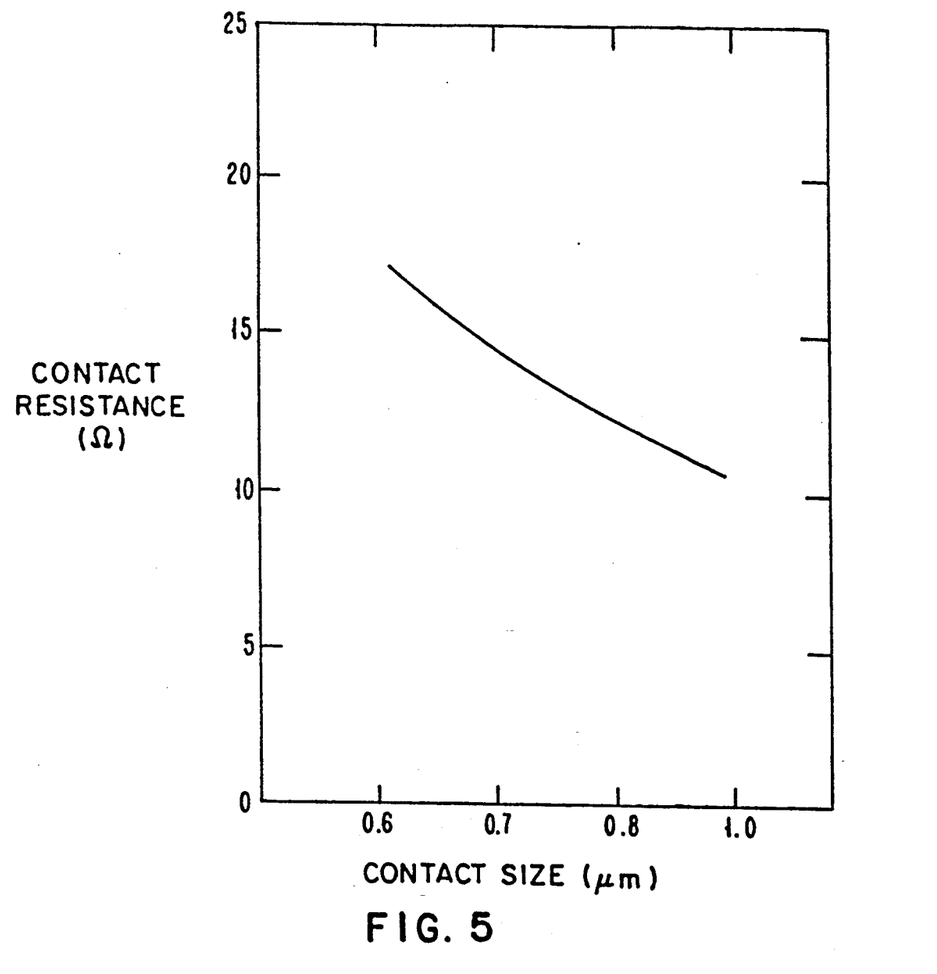
FIG. 5 is a plot of contact resistance versus contact size of a refractory metal film found in accordance with the present invention.

FIG. 4 shows the change in the resistivity of the tungsten layer of approximately 150 nm as a function of the turret temperature. It has been determined that the ideal range of the turret temperature is approximately between 430° and 480° C., as temperatures above that result in poor selectivity of the deposition while temperatures below that begin to result in increased resistivity, poor adhesion and high stress. Thus, the method of the invention provides an excellent tungsten film having a resistivity of less than 17 ohm-cm. FIG. 5 shows the change in contact resistance as the size of the contact is increased. Several diode junctions were formed having a W/TiN/$TiSi_2$ contact. The graph of FIG. 5 shows that as the contact size increased from 0.6 to 1.0 $\mu$m, the contact resistance decreased from 17 to 10 ohms.

Figure 6:
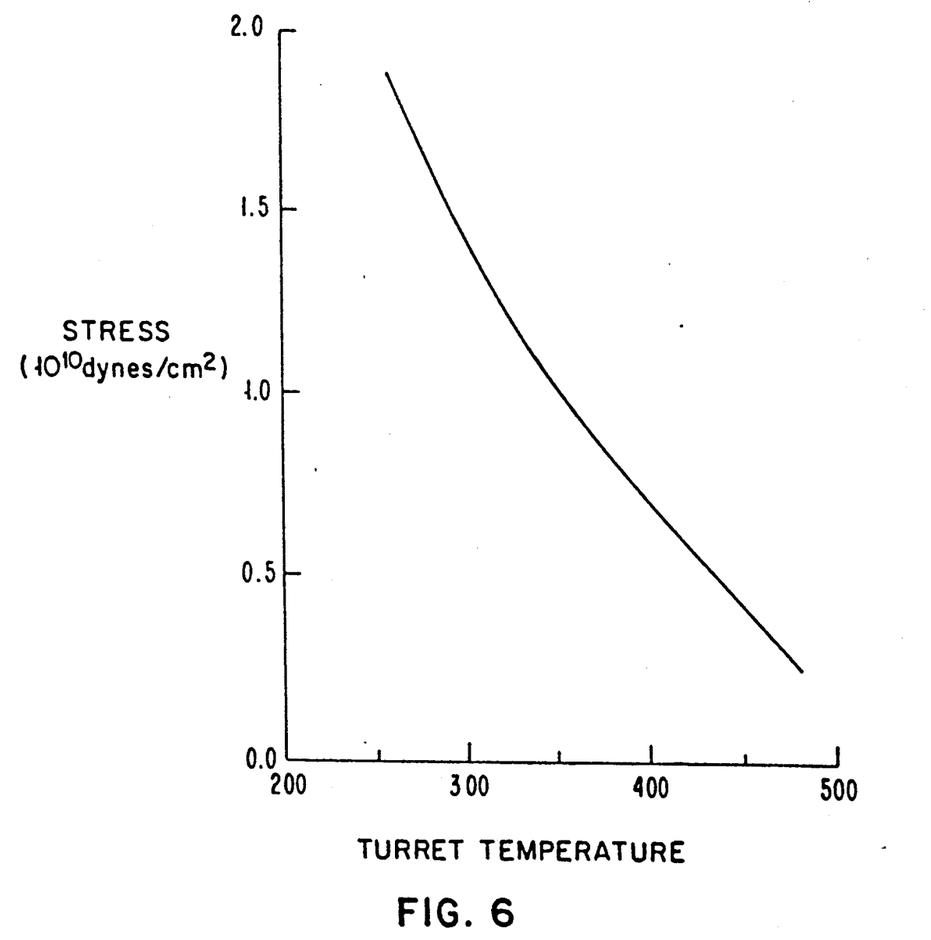
FIG. 6 is a plot of stress versus turret temperature of a refractory metal film formed in accordance with the method of the present invention.

FIG. 6 is a plot showing stress as a function of turret temperature indicating that the stress significantly increases as the temperature is reduced. Thus, for the production of a low stress film with good selectivity, the deposition process should take place in high temperatures, which includes the broad range between 370° and 550° C. and preferably between 430° and 480° C. The process according to the present invention deposits tungsten on self-aligned TiN/TiSi$_2$ which enhances the conductivity of the source, drain and gate contacts for submicron semiconductor devices without degrading junctions in the gate oxide. In addition, the nitride layer acts as a barrier against fluorine attack during the tungsten deposition steps.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

Having thus described the invention, what is claimed as and what is desired to be secured by Letters Patent is:

1. A field effect transistor comprising:
    a silicon substrate having spaced source and drain regions formed therein;
    a silicon gate region disposed on said substrate between said source and drain region, a gate oxide region disposed between said silicon gate region and said substrate sidewall oxide spacer regions disposed on said silicon gate region and recessed oxide isolation regions being disposed on opposed sides of said source and drain regions thereby exposing the surfaces of said source and drain regions;
    a barrier layer disposed on and in contact with said source and drain regions and said gate region, said barrier layer comprising a refractory metal silicide lower layer and a refractory metal nitride upper layer;
    a layer of refractory metal disposed on said barrier layer forming source, drain and gate contacts.

2. The field effect transistor of claim 1 where said refractory metal layer forming said source, drain and gate contacts comprises a refractory metal selected from the group consisting of tungsten, molybdenum and tantalum.

3. The field effect transistor of claim 2 wherein said refractory metal barrier layer comprises a silicide and a nitride of a refractory metal selected from the group consisting of titanium, niobium, zirconium, chromium and hafnium.

4. The field effect transistor of claim 3 wherein the source, drain and gate contact comprises tungsten, and said barrier layer comprises a titanium silicide lower layer and a titanium nitride upper layer.

* * * * *

UNITED STATES PATENT AND TRADEMARK OFFICE
CERTIFICATE OF CORRECTION

PATENT NO. : 5,221,853
DATED : June 22, 1993
INVENTOR(S) : Rajiv V. Joshi, et al.

It is certified that error appears in the above-indentified patent and that said Letters Patent is hereby corrected as shown below:

```
        Column 3, line 11:   after "steps" insert --in--
        Column 3, line 64:   after "provided" insert --.--
        Column 4, line 61:   after "deposition"
insert --.--
        Column 6, line 48:   before "resistivity"
insert --The--
        Column 6, line 59:   "ohm-cm"  should read as
--μohm-cm--
```

Signed and Sealed this

Twenty-ninth Day of March, 1994

Attest:

BRUCE LEHMAN

*Attesting Officer*  *Commissioner of Patents and Trademarks*